INVENTOR.
FRANZ L. PUTZRATH
BY
Eugene M. Whitacre
ATTORNEY

April 28, 1964 F. L. PUTZRATH 3,131,312
CIRCUIT FOR LINEARIZING RESISTANCE OF A FIELD-EFFECT TRANSISTOR TO BIDIRECTIONAL CURRENT FLOW
Filed Aug. 5, 1960 3 Sheets-Sheet 2

INVENTOR.
FRANZ L. PUTZRATH
BY Eugene M. Whitacre
ATTORNEY

INVENTOR.
FRANZ L. PUTZRATH
BY
Eugene M. Whitacre
ATTORNEY 3,131,312

CIRCUIT FOR LINEARIZING RESISTANCE OF A FIELD-EFFECT TRANSISTOR TO BIDIRECTIONAL CURRENT FLOW

Franz Ludwig Putzrath, Oaklyn, N.J., assignor to Radio Corporation of America, a corporation of Delaware Filed Aug. 5, 1960, Ser. No. 47,708
12 Claims. (Cl. 307—88.5)

This invention relates to semiconductor circuits and more particularly to semiconductor circuits utilizing unipolar transistors.

A unipolar transistor is a three electrode device made of semiconductor material, such as germanium or silicon, and has first and second regions of opposite conductivity types. The two regions are fabricated contiguous to each other to form a rectifying P–N junction and the second region is more heavily doped with impurities than the first. Two electrodes, the drain and the source, are ohmically connected to opposite ends of the first region. When a potential difference is applied between the drain and source electrodes, majority carrier or "working" current flows through the intermediate or channel portion of the first region between the two electrodes. A third electrode, the gate, is ohmically connected to the second region, and when energized to reverse bias the P–N junction, heretofore done by reverse biasing with respect to the source electrode only, controls the amount of channel current flowing between the drain and source electrodes.

The control of the channel current by the gate electrode biasing voltage permits the unipolar transistor to be used as a variable resistance device with particular values of channel resistance being determined by the value of the gate electrode reverse biasing voltage. Additionally, this feature permits a unipolar transistor to operate as a mixer or multiplier of applied gate and drain-source voltage signals wherein a varying gate reverse biasing voltage modulates the channel current flowing due to the drain-source signal voltage.

However, the drain-source channel resistance has been found to be non-linear. Consequently, a varying signal voltage applied between the drain and source electrodes will have distortion components introduced into it because the channel resistance will increase for excursions of the signal voltage in one direction but decrease on opposite polarity signal voltage excursions resulting in a distorted signal output.

This non-linearity in channel resistance is due to the changes that occur in the depletion layer, or insulating region, adjacent the P–N junction caused by changes in reverse biasing voltage across the P–N junction. The reverse biasing voltage across the P–N rectifying junction is not only due to the gate electrode biasing voltage but is also affected by a potential difference existing between the drain and source electrodes. Depending on the polarity, a drain-source signal voltage either adds a component to the depletion layer existing by virtue of the gate electrode reverse biasing voltage or subtracts a component from it. This occurs because the signal voltage in its positive and negative excursions is either aiding or opposing the gate reverse biasing voltage. Consequently the depletion layer varies with the drain-source signal voltage, and since the drain-source resistance is a function of the depletion layer, this resistance is non-linear. This non-linearity severely restricts the operaton of unipolar transistors when used as variable resistances or signal mixers.

Accordingly, it is an object of the present invention to provide an improved circuit which reduces non-linearity in the channel resistance of a unipolar transistor.

It is another object of this invention to provide an improved unipolar transistor circuit which will function as an electronically variable linear resistance.

It is another object of this invention to provide an improved unipolar transistor circuit which can function as a linear resistance with an alternating signal voltage applied to the drain and source electrodes.

It is a further object of this invention to provide an improved unipolar transistor circuit which reduces undesirable changes in the reverse biasing voltage caused by varying signals applied between the drain and source electrodes.

It is still a further object of this inventon to provide an improved unipolar transistor circuit which maintains the channel resistance substanially constant for relatively large variations of drain to source voltage at a given gate biasing voltage.

A semiconductor circuit in accordance with the invention includes a unipolar transistor having drain, source and gate electrodes. A voltage divider network is connected between the drain and source electrodes and a control voltage source is connected between the gate electrode and an intermediate point on the voltage divider. The control voltage source is poled to reverse bias the gate electrode with respect to both the drain and source electrodes through the voltage divider. The average reverse bias across the rectifying junction is maintained substantially constant when a signal voltage is applied between the drain and source electrodes. This action is attributable to the voltage divider network which due to the signal voltage causes equal and opposite changes in the reverse bias voltage between the gate and the drain, and between the gate and the source electrodes, thus producing a constant average voltage across the junction. With the circuit described, it has been found that the resistance between the source and drain electrodes remains constant for wide signal voltage swings.

The novel features which are considered to be characteristic of this invention are set forth with particularity in the appended claims. The invention itself, both as to organization and method of operation, as well as additional advantages and objects thereof, will best be understood by referring to the accompanying drawing and the following description in which:

Figure 1:
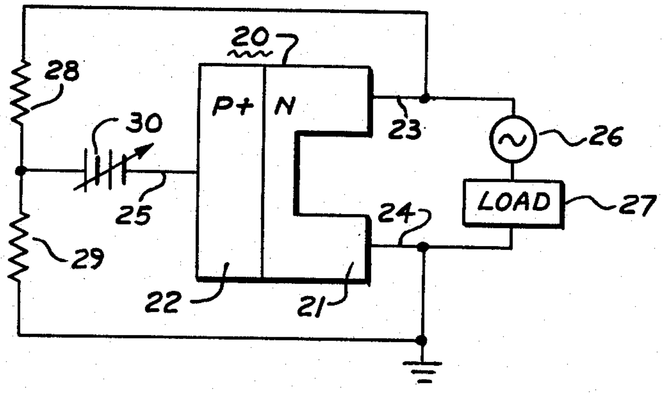
FIGURE 1 is a schematic circuit diagram of a semiconductor circuit embodying the invention.

Referring to the drawing wherein like reference numerals are used to designate like components in the various figures thereof, and particularly to FIGURE 1, a unipolar transistor 20 comprises a first region 21 of semiconductor material of N type conductivity and a second region 22 of P type conductivity formed in intimate contact with each other to create a rectifying junction. The second or P type region 22 is more heavily doped with impurities than the first or N type region 221. A drain electrode 23 and a source electrode 24 are ohmically connected to spaced portions on the first region 21 and a gate electrode 25 is ohmically connected to the second region 22. A signal voltage source 26, which may be alternating as well as unidirectional, is connected in series with a load 27 between the drain 23 and source 24 electrodes. The source electrode 24 is connected to a point of reference potential, or ground, in the circuit. A voltage divider, including a pair of resistors 28 and 29, is also connected across the drain 23 and source 24 electrodes and the junction of the resistors 28 and 29 is connected through a variable control voltage source 30 to the gate electrode 25. The control voltage source 30 is poled to reverse bias the P–N junction and may be located remote from the unipolar transistor 20. The values of the resistors 28 and 29 are chosen to be much smaller than the reverse biased junction leakage resistances between the gate 25 and the drain 23 electrodes and between the gate 25 and source 24 electrodes respectively. Thus, substantially all of the terminal voltage of the control voltage source 30 appears as a reverse bias voltage across the rectifying junction rather than across the voltage divider resistors. Additionally the sum of the values of resistors 28 and 29 are chosen to be greater than the highest value of useful channel resistance so that the channel resistance of the transistor 20 may control the amount of current through the load 27.

In operation, the signal voltage source 26 will create a potential difference between the drain 23 and the source 24 electrodes and cause majority carrier, in this case electron, current flow between the two electrodes and through the load 27. Current flow may be in either direction, depending on the instantaneous polarity of the signal voltage source 26. The amount of current flow will be dependent upon the potential values of the reverse biasing control voltage source 30 and the signal source 26.

Figure 2:
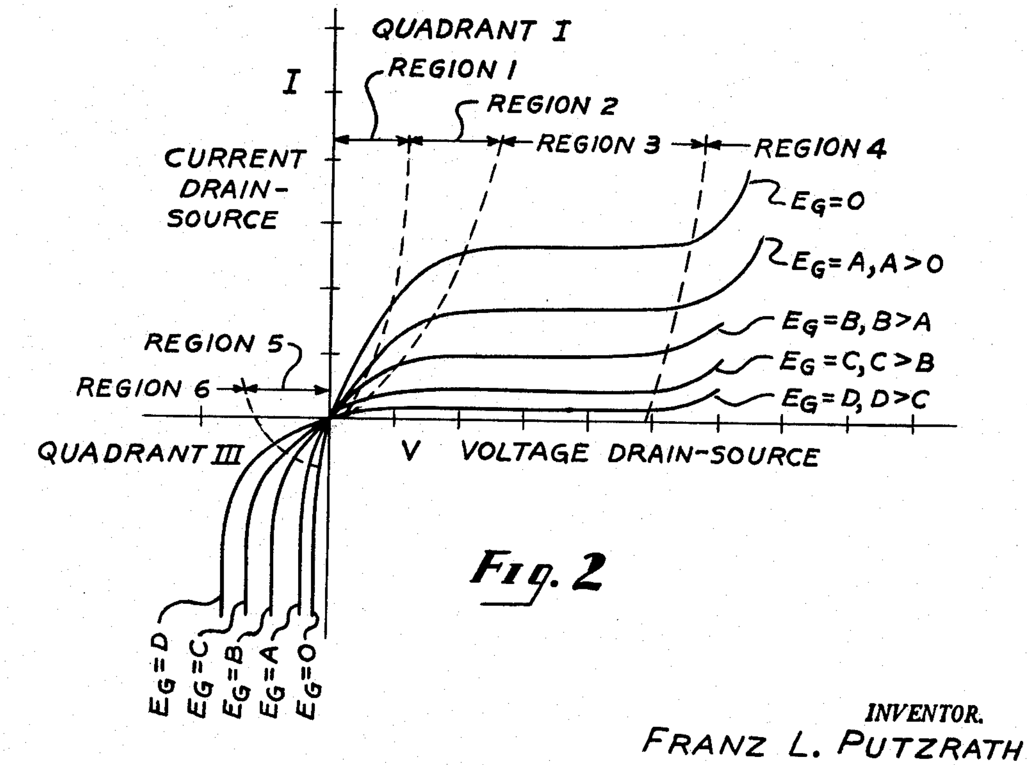
FIGURE 2 is a graphical representation of the normal drain to source voltage-current characteristics of a unipolar transistor, with various values of gate biasing voltage.

This dependence may be seen by referring to FIGURE 2. There are six distinct regions in the normal voltage-current characteristic of a unipolar transistor. In quadrant I, there are four regions; a first region close to the origin where the resistance of the channel depends primarily on the reverse biasing control voltage source 30, a second region where the channel resistance has a greater non-linearity due to the effect of increasing the voltage of the signal source 26 which, in circuits used heretofore, increases the reverse biasing voltage and expands the depletion layer, or insulating region, adjacent the rectifying junction thereby increasing the channel resistance; a third region of relatively constant current (the pinch-off region) or high channel resistance which occurs when the source-to-drain voltage exceeds the pinch-off voltage level for the particular gate biasing voltage that is used, thereby expanding the depletion layer so that it extends completely across, or "pinches-off," the channel; and a fourth region where the reverse biasing voltage due to both the control voltage source 30 and signal source 26 exceeds the breakdown voltage of the transistor and avalanche breakdown occurs. In quadrant III, where a reversal of polarity of the drain-source signal voltage occurs, there are only two distinct regions; a fifth region close to the origin where again the resistance of the channel depends primarily on the reverse biasing control voltage source 30 and a sixth region where the effect of the reversal of polarity of the drain-source signal voltage has so reduced the reverse biasing voltage that the depletion layer and therefore the resistance of the channel becomes increasingly smaller permitting large channel current to flow.

For use as an electronically variable resistance, the peak voltage of the signal source 26 should not exceed the pinch-off voltage existing for a particular gate biasing voltage setting. In addition, it is important that the rectifying P–N junction always be reverse biased for all values of signal source 26 voltages so that bipolar (both holes and electrons) current does not flow across the P–N junction.

By varying the voltage of the control voltage source 30, the channel resistance will assume different values as may be seen from the various slopes in FIGURE 2. Consequently different values of resistance will be placed in series with the load 27 and the current through the load 27 will be controlled by the control voltage source 30. The control voltage source 30 may be located remotely from both the load 27 and the transistor 20 and remote control of the load 27 current may be thereby achieved.

With the circuit shown in FIGURE 1, the value of channel resistance, determined by the setting of the control voltage source 30, will remain substantially constant even though the signal source 26 is varying. As the signal source 26 voltage increases in a positive direction with respect to ground, the reverse biasing voltage across the rectifying junction between the gate 25 and drain 23 eletcrodes increases from the value determined by the control source 30 by an amount equal to the voltage drop across the resistor 28. At the same time, the reverse biasing voltage across the rectifying junction between the gate 25 and source 24 electrodes decreases from the value determined by the control source 30 by an amount equal to the voltage drop across the resistor 29. When the resistors 28 and 29 are equal, the increase in reverse bias at the drain electrode 23 will be offset by the decrease at the source electrode 24. Consequently an increase in resistance in the upper part of the channel of the transistor 20 near the drain electrode 23 will be substantially offset by a decrease in resistance of the channel near the source electrode 24.

Similarly, as the voltage of the signal source 26 goes negative with respect to ground, the reverse biasing voltage between the gate 25 and drain 23 electrodes decreases from the voltage setting of the control voltage source 30 by an amount equal to the voltage drop across the resistor 28 and the reverse biasing voltage between the gate 25 and source 24 electrodes increases by an amount equal to the voltage drop across resistor 29. Therefore on both the positive and negative excursions of the voltage from the signal source 26, the channel resistance of the unipolar transistor 20 remains constant. The voltage dividing resistors 28 and 29 compensate for changes in reverse biasing voltage caused by variations in the voltages applied from the signal source 26 and thereby maintain the resistance of the channel constant at the value determined by the control voltage source 30.

Figure 3:
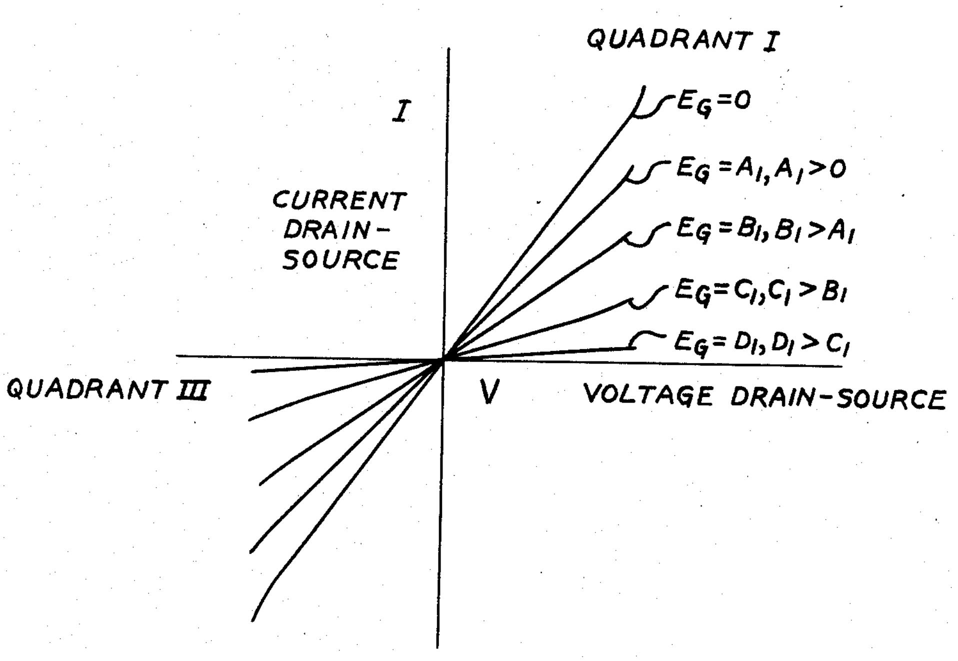
FIGURE 3 is a graphical representation of the drain to source voltage-current characteristic of a unipolar transistor circuit embodying the invention, with various values of gate biasing voltage.

The extent of the linearization of the channel resistance, for circuits constructed in accordance with the invention, may be seen by referring to FIGURE 3. The non-linear channel resistance characteristics of unipolar transistor circuits heretofore known was discussed in connection with FIGURE 2. As shown in FIGURE 3, the channel resistances for the various values of the gate electrode reverse biasing voltage are not only linear but are also symmetrical for both positive and negative excursions of applied signal voltage. This symmetry is due to the fact that the variations of the voltage between the source and drain electrodes are applied as equal and opposite changes superimposed on the reverse biasing voltage between the drain 23 and gate 25 electrodes and the source 24 and gate 25 electrodes. Since the drain 23 and source 24 electrodes are symmetrically connected in the circuit, they react in the same manner for opposite polarity excursions of the signal voltage therebetween. Consequently, the channel resistance is substantially linear regardless of the polarity of the applied signal voltage.

Thus a unipolar transistor circuit constructed in accordance with the invention may be used as an electronically variable linear resistance to control the current through a load. The resistance may be varied remotely by a control voltage and thereby achieve remote control of the load. The channel resistance will not change as the signal voltage varies and both unidirectional and alternating signal voltages may be applied to the transistor. Rapid electronic control of a load may be achieved with no switching transients introduced by the transistor, as would occur in known types of control circuit. In addition, the circuit increases the range of values of signal voltages that may be applied to the transistor without the channel resistance becoming non-linear and introducing undesired distortion. There is also an effective separation of the controlled signal from the control voltage since the impedance across the reverse biased rectifying junction is on the order of 10 to 100 megohms.

Figure 4:
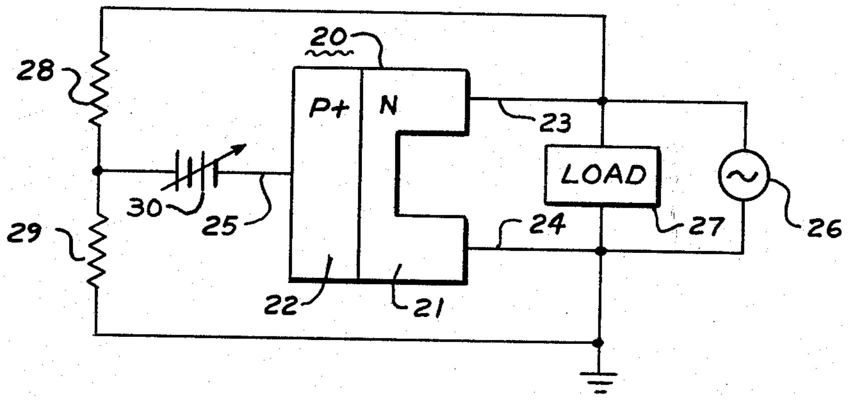
FIGURE 4 is a schematic circuit diagram of an embodiment of the invention utilizing shunt control of a load by a unipolar transistor.

The embodiment of the invention shown in FIGURE 4 provides a shunt control of the load 27. In this embodiment, the channel resistance of the unipolar transistor 20 shunts the load 27 and an increase or decrease in the control voltage source 30 will cause an increase and decrease respectively of the current flowing through the load 27. The values of the resistors 28 and 29 should be chosen to be substantially higher than the useful range of values of channel resistance to afford effective shunt control of the load 27 current by the transistor 20 channel resistance.

Figure 5:
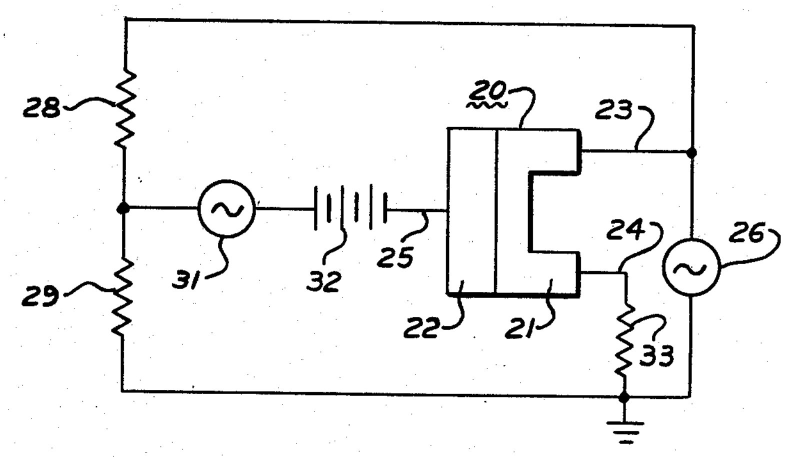
FIGURE 5 is a schematic circuit diagram of another embodiment of the invention wherein a unipolar transistor is used as a mixer or multiplier.

Referring to FIGURE 5, a specific embodiment of the invention utilized as a mixer or multiplier is shown. By connecting an oscillatory voltage source 31 in series with a fixed gate reverse biasing source 32, the oscillatory voltage from the source 31 will modulate a signal derived from the source 26. The mixed signal output will be a current which may be obtained from a load resistance 33 connected between the source electrode 24 and ground. The oscillatory voltage from the source 31 will vary the channel resistance of the unipolar transistor 20 according to the amplitudes of oscillations and therefore amplitude modulates the signal from the source 26.

However, due to the fact that the modulating signal 31 also has a direct voltage component due to the reverse biasing source 32, the mixed signal output also includes the frequency of the carrier signal received from the source 26. This may be derived mathematically by multiplying an oscillatory signal containing both a fixed D.C. component and a sinusoidally oscillating component (i.e. $A+B \cos w_1t$), by the carrier wave of the source 26 (i.e. $C \cos w_2t$). The resultant signal included, in addition to the sum and difference frequencies, a signal corresponding in frequency to the carrier wave of the source 26. Linear mixing, which is defined as a mixed signal containing only the sum and difference frequencies of the modulated and modulating signal frequencies, is therefore not achieved.

Figure 6:
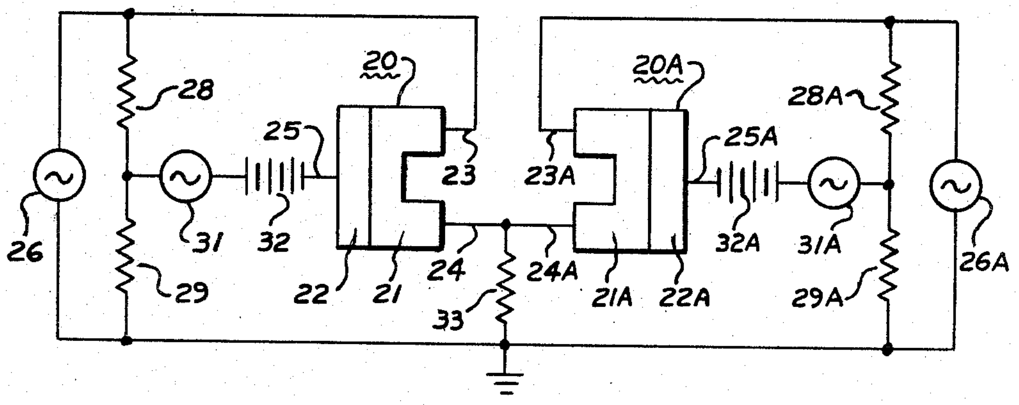
FIGURE 6 is a schematic circuit diagram of still another embodiment of the invention using a unipolar transistor as a linear mixer or multiplier.

The circuit shown in FIGURE 6 may be utilized to obtain linear mixing. A matched circuit, except for the fact that the signals derived from sources 26 and 31 are 180° out of phase with the signals derived from sources 26A and 31A respectively, is provided so that equal but opposite signals of the frequency of the sources 26 and 26A cancel each other. However, the mixing in each of the sections produces in phase signals corresponding in frequency to the sum and difference of the signals from the sources 26 and 31. Thus, the resultant amplitude of the sum and difference frequencies developed across the resistor 33 is twice that developed across the corresponding resistor of FIGURE 5 for signals of the same amplitude from the various sources.

The resistances 28 and 29 of FIGURE 5, and 28, 29, 28A and 28B of FIGURE 6, tend to maintain linear the resistance between the source and drain electrodes of the respective unipolar transistors as the drain source voltage varies. Since the drain-source resistance is linear, multiplication of the applied signals may be attained without the introduction of a large number of harmonics and other spurious signals as is the case with non-linear mixers. Linear mixers simplify the design of signal receiver circuitry and filter design by minimizing the spurious frequency components that arise in most mixers.

What is claimed is:

1. A signal translating circuit comprising in combination a unipolar transistor including drain, source and gate electrodes, a voltage divider connected between said drain and source electrodes, means providing a source of signals to be controlled connected between said drain and source electrodes, a control voltage source connected between said gate electrode and an intermediate point on said voltage divider, said control voltage source poled to reverse bias said gate electrode with respect to both said drain and source electrodes through said voltage divider.

2. In an electrical circuit including a semi-conductor device having first and second electrodes between which current is adapted to flow without crossing a rectifying junction, and a third electrode for controlling said current flow, said semiconductor device including a rectifying junction between said third electrode and said first and second electrodes, said device exhibiting a non-linear resistance characteristic between said first and second electrodes, the combination for reducing the non-linearity of said resistance characteristic comprising means providing a source of signals coupled between said first and second electrodes to produce a current between said electrodes, and means interconnecting said three electrodes to maintain said third electrode reverse biased with respect to both said first and second electrodes, said interconnecting means also applying one portion of the signal from said source means between said third electrode and said first electrode to change the reverse bias in one direction and applying another portion of the signal from said source means between said third electrode and said second electrode to change the reverse bias in the opposite direction whereby the non-linearity in said resistance characteristic is reduced.

3. A signal translating circuit comprising a semi-conductor having a region of one conductivity type and a region of opposite conductivity type, said regions of opposite conductivity being in intimate contact to form a rectifying junction, a pair of electrodes electrically connected to spaced points on one of said regions, means for applying a signal voltage between said pair of electrodes to cause majority carrier current flow between said electrodes, a third electrode electrically connected to the other of said regions to control majority carrier current flow between said pair of electrodes, a voltage divider connected between said pair of electrodes to provide a signal voltage at an intermediate point thereon which is of an amplitude intermediate the amplitudes of the signal voltages at said pair of electrodes, means providing a potential source, and means for connecting said potential source between said third electrode and said intermediate point on said voltage divider to reverse bias said third electrode with respect to said first and second electrodes.

4. A signal translating circuit comprising a semi-conductor having a region of one conductivity type and a region of opposite conductivity type, said regions of opposite conductivity being in intimate contact to form a rectifying junction, a pair of electrodes electrically connected to spaced points on one of said regions, means for applying a signal voltage from a first signal source to said pair of electrodes to cause majority carrier current flow between said electrodes, a third electrode electrically connected to the other of said regions to control majority carrier current flow between said pair of electrodes, a voltage divider connected between said pair of electrodes, means providing the series combination of a D.C. potential source and a second signal source, and means for connecting said D.C. potential source and said second signal source between said third electrode and an intermediate point on said voltage divider to control majority carrier current flow between said pair of electrodes.

5. A semiconductor circuit comprising in combination a unipolar transistor having gate, source and drain electrodes, means for applying a signal voltage to said drain and source electrodes, a voltage divider, said voltage divider connected between said drain and source electrodes, and means providing a control voltage source to maintain said gate electrode reverse biased with respect to said drain and source electrodes and connected between said gate electrode and an intermediate point on said voltage divider.

6. In an electrical circuit including a unipolar transistor having gate, source and drain electrodes, with a signal voltage source connected between said source and drain electrodes to cause current flow in a conductive channel between said drain and source electrodes, said conductive channel ordinarily exhibiting a non-linear resistance to said signal voltage, and a control voltage source for reverse biasing said gate electrode with respect to said drain and source electrodes; the combination comprising a voltage divider including a pair of resistors connected in series between said source and drain electrodes, and means connecting the junction of said series resistors to said gate electrode through said control voltage source, whereby said conductive channel exhibits a substantially linear resistance to said signal voltage, the magnitude of said resistance being a function of the magnitude of the control voltage of said control voltage source.

7. In an electrical circuit including a unipolar transistor having gate, source, and drain electrodes with a signal voltage source and a load connected between said source and drain electrodes to cause current flow from said signal voltage source through a conductive channel between said drain and source electrodes and through said load, said conductive channel exhibiting a non-linear resistance as said signal voltage varies, the combination comprising a voltage divider including a pair of serially connected resistors, means for connecting said voltage divider between said source and drain electrodes, an adjustable control voltage source for reverse biasing said gate electrode with respect to said drain and source electrodes and thereby control current flow in said channel and said load connected between the junction of said serially connected resistors and said gate electrode, whereby said transistor conductive channel exhibits a substantially linear resistance to said signal voltage.

8. An electrical circuit comprising:
a field-effect transistor including gate, source and drain electrodes;
means providing a source of signals to be controlled;
first circuit means including the source-to-drain current path of said transistor coupled to said source of signals to provide a bidirectional current path for signals from said source of signals; and
second circuit means for applying a predetermined fraction of the total signal voltage developed between said source and drain electrodes to said gate electrode to maintain said gate electrode at a signal potential intermediate the signal potentials existing at said source and drain electrodes, said potentials being measured with respect to a point of reference potential in said circuit.

9. An electrical circuit as defined in claim 8 wherein said second circuit means includes a pair of series connected resistors of substantially equal value coupled between said source and drain electrodes with the junction thereof coupled to said gate electrode.

10. An electrical circuit comprising:
a field-effect transistor including a gate electrode, and first and second electrodes interchangeably operative as source and drain electrodes;

means providing a source of signals to be controlled;
first circuit means including the source-to-drain current path of said transistor coupled to said source of signals to provide a bidirectional current path for signals from said source of signals;
bias means coupled to said gate electrode to control the resistivity of the current path between said source and drain electrodes;
resistive means coupled between said source and drain electrodes; and
means coupling said gate electrode to a point on said resistive means where a given signal voltage in one polarity direction produces substantially the same effect on current flow in said current path as said given signal voltage in the opposite polarity direction.

11. An electrical circuit comprising:
a field-effect transistor including gate, source and drain electrodes;
first and second terminals for connection to a source of signals to be controlled;
third and fourth terminals for connection to a utilization circuit;
means connecting said source electrode to said first terminal and said drain electrode to said third terminal;
means connecting said second and fourth terminals in common;
first and second resistance means serially connected between said first and third terminals to provide at the junction thereof a signal voltage with respect to said second and fourth terminals which is of intermediate value between the voltages at said first and third terminals with respect to said second and fourth terminals;
means for coupling the junction of said first and second resistance means to said gate electrode; and
bias voltage means coupled to said gate electrode for controlling the resistivity between said source and drain electrodes.

12. An electrical circuit comprising:
a field-effect transistor including gate, source and drain electrodes;
first and second terminals for connection to a source of signal to be controlled, one of said terminals being at a point of reference potential;
utilization circuit means coupled between said first and second terminals;
means connecting said drain electrode to said first terminal and said source electrode to said second terminal;
first and second resistance means coupled between said first and second terminals; means coupling the junction of said first and second resistance means to said gate electrode; and
bias voltage means connected to said gate electrode for controlling the resistivity between said source and drain electrodes.

References Cited in the file of this patent

UNITED STATES PATENTS

| | | |
|---|---|---|
| 2,820,152 | Mathis et al. | Jan. 14, 1958 |
| 2,988,688 | Benton | July 13, 1961 |
| 3,005,937 | Wallmark et al. | Oct. 24, 1961 |